United States Patent [19]
Norris

[11] Patent Number: 5,534,844
[45] Date of Patent: Jul. 9, 1996

[54] COMPARATOR CIRCUIT

[75] Inventor: David Norris, Austin, Tex.

[73] Assignee: Advanced Micro Devices, Inc., Sunnyvale, Calif.

[21] Appl. No.: 415,266

[22] Filed: Apr. 3, 1995

Related U.S. Application Data

[62] Division of Ser. No. 333,410, Nov. 2, 1994, Ser. No. 333,451, Nov. 2, 1994, Ser. No. 333,537, Nov. 2, 1994, Ser. No. 333,387, Nov. 2, 1994, Ser. No. 334,462, Nov. 2, 1994, Ser. No. 333,564, Nov. 2, 1994, Ser. No. 333,389, Nov. 2, 1994, Ser. No. 333,398, Nov. 2, 1994, Ser. No. 333,536, Nov. 2, 1994, Ser. No. 333,562, Nov. 2, 1994, Ser. No. 334,461, Nov. 2, 1994, Ser. No. 334,463, Nov. 2, 1994, Ser. No. 333,403, Nov. 2, 1994, Ser. No. 333,399, Nov. 2, 1994, Ser. No. 333,535, Nov. 2, 1994, Ser. No. 333,467, Nov. 2, 1994, Ser. No. 333,386, Nov. 2, 1994, Ser. No. 333,460, Nov. 2, 1994, and Ser. No. 399,951, Mar. 6, 1995.

[51] Int. Cl.$^6$ ..................................................... G06F 7/02
[52] U.S. Cl. ......................................................... 340/146.2
[58] Field of Search ........................................... 340/146.2

[56] References Cited

U.S. PATENT DOCUMENTS

| | | | |
|---|---|---|---|
| 4,012,714 | 3/1977 | Lohmann | 340/146.2 |
| 4,903,005 | 2/1990 | Sakashita et al. | 340/146.2 |
| 5,247,210 | 9/1993 | Swanson | 327/63 |
| 5,266,918 | 11/1993 | Won et al. | 340/146.2 |
| 5,272,395 | 12/1993 | Vincelette | 327/63 |

OTHER PUBLICATIONS

Neil Weste and Kamran Eshraghian, "Principles of CMOS VLSI Design, A Systems Perspective," *Addison–Wesley Publishing Co.*, pp. 333–335 ©1983.

*Primary Examiner*—John S. Heyman
*Attorney, Agent, or Firm*—Fulbright & Jaworski

[57] ABSTRACT

A static-type comparator, which compares the magnitude of a first binary number with a second binary number and determines if the first binary number is equal to, greater than, or less than the second binary number, is described. The comparator comprises a carry chain of comparison cells. Each comparison cell in the carry chain compares the magnitude of a different bit position of the first number with a corresponding bit position in the second number. The comparison cells input a first voltage signal, representing a binary value of a bit position of the first number, and a second voltage signal, representing a binary value of a corresponding bit position of the second number. A voltage signal from a voltage source Vcc is input into the carry chain and propagates through the chain until a comparison cell detects that there is a difference in magnitudes for a particular bit position. If a difference in magnitudes is detected, the comparison cell will output a voltage signal indicating whether the first number is greater than or less than the second number. If the numbers are equal, voltage signal Vcc propagates through the entire carry chain and is output. In the preferred embodiment, the comparator includes decode circuitry for decoding the carry chain's outputs. The comparator preferably also inputs a timing signal to time the comparator's operations.

14 Claims, 4 Drawing Sheets

COMPARATOR CIRCUIT

CROSS-REFERENCE TO RELATED APPLICATIONS

The present application is related to and a divisional of the following patent applications filed on Nov. 2, 1994, all of which are assigned to the common assignee of the present invention, and all of which are hereby incorporated by referenced thereto and made a part hereof as if fully set forth herein:

Hazard-Free Divider Circuit, application Ser. No. 08/333,410; Monolithic PC Audio Circuit, application Ser. No. 08/333,451; Modular Integrated Circuit Power Control, application Ser. No. 08/333,537; Audio Processing Chip with External Serial Port, application Ser. No. 08/333,387; Wavetable Audio Synthesizer with Delay-Based Effects Processing, application Ser. No. 08/334,462; Wavetable Audio Synthesizer with Low Frequency Oscillators for Tremolo and Vibrato Effects, application Ser. No. 08/333,564; Wavetable Audio Synthesizer with Multiple Volume Components and Two Modes of Stereo Positioning, application Ser. No. 08/333,389; Wavetable Audio Synthesizer with an Interpolation Technique for Improving Audio Quality, application Ser. No. 08/333,398; Monolithic PC Audio Circuit with Enhanced Digital Wavetable Audio Synthesizer, 08/333,536; Wavetable Audio Synthesizer with Waveform Volume Control for Eliminating Zipper Noise, application Ser. No. 08/333,562; Digital Signal Processor Architecture for Wavetable Audio Synthesizer, application Ser. No. 08/334,461; Wavetable Audio Synthesizer with Enhanced Register Array, application Ser. No. 08/334,463; A Digital Decimation and Compensation Filter System, application Ser. No. 08/333,403; Digital Interpolation Circuit for Digital-to-Analog Converter Circuit, application Ser. No. 08/333,399; Analog-to-Digital Converter Circuit, application Ser. No. 08/333,535; Stereo Audio Codec, application Ser. No. 08/333,467; Digital Noise Shaper Circuit, application Ser. No. 08/333,386; and Digital-to-Analog Converter Circuit, application Ser. No. 08/333,460.

The present application is also related to and a divisional of patent application Ser. No. 08/399,951, filed on Mar. 6, 1995, and entitled "Wavetable Audio Synthesizer with Left Offset, Right Offset and Effects Volume Control," which is assigned to the common assignee of the present invention, and which is hereby incorporated by reference and made a part hereof as if fully set forth herein.

BACKGROUND OF THE INVENTION

1. Field of the Invention

This invention relates to a comparator circuit. More particularly, this invention relates to a static-type comparator circuit that compares the magnitude of two binary numbers and determines if the numbers are equal, or if one number is greater than or less than the other number.

2. Brief Description of the Related Technology

Figure 1:
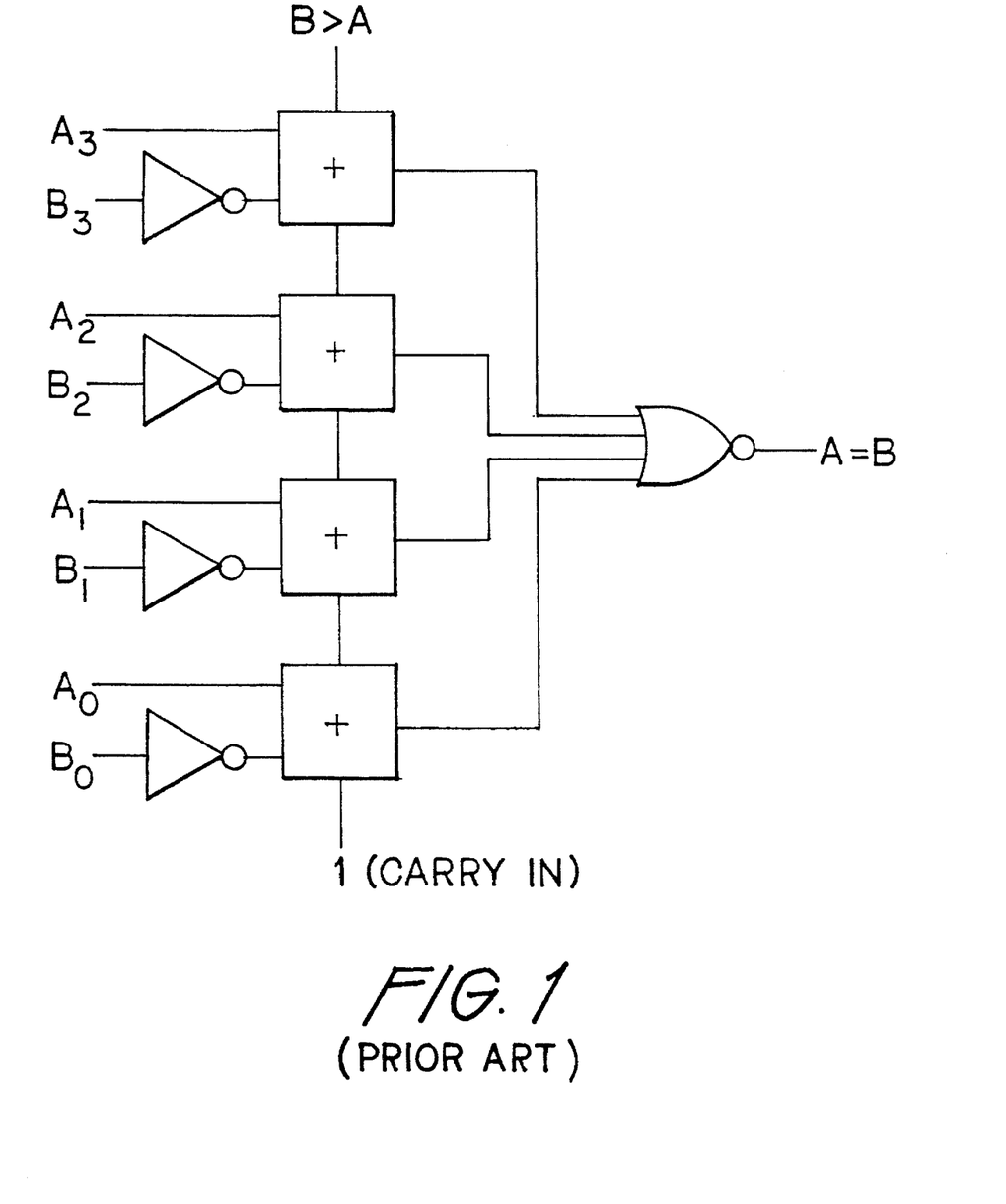
FIG. 1 is a circuit diagram of a prior art comparator.
Figure 2A:
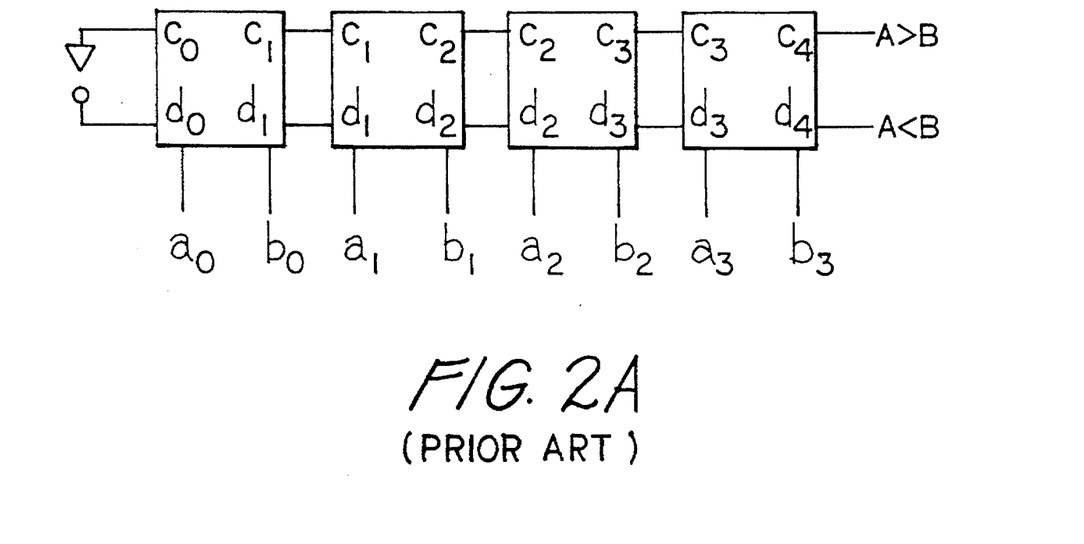
FIG. 2a is a circuit diagram of another prior art comparator.
Figure 2B:
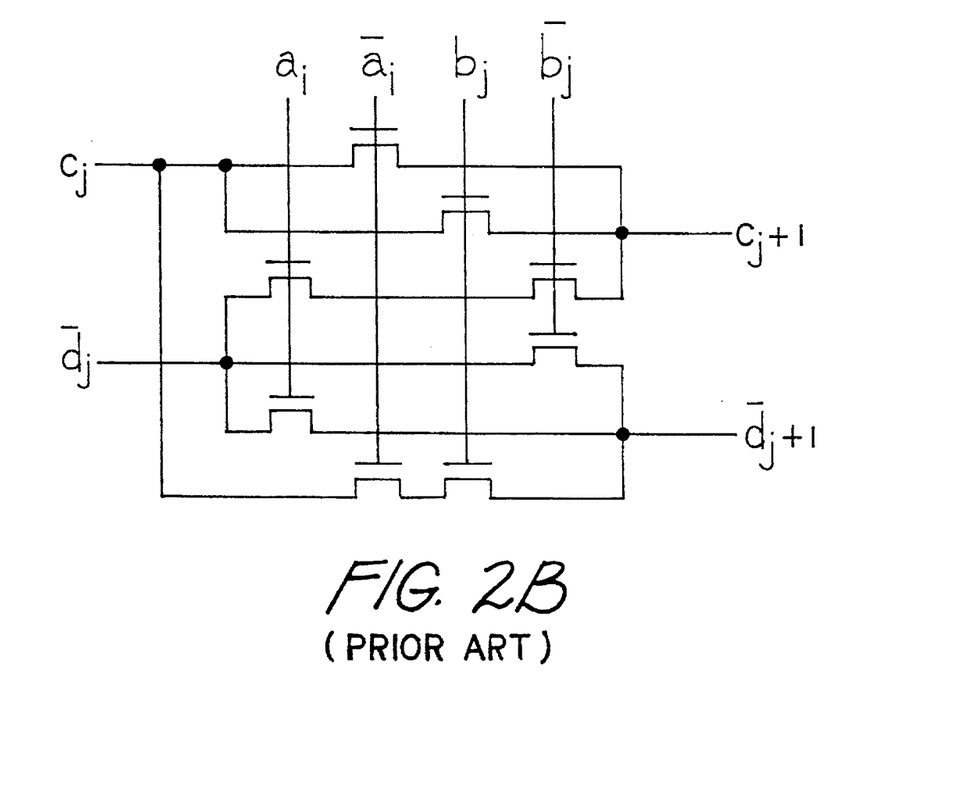

Comparators may be used for comparing the magnitude of binary numbers. FIG. 1 illustrates a static-type, magnitude comparator comprising adders and complementers. The comparator of FIG. 1 can determine if a first binary number (A) is equal to or less than a second binary number (B). FIG. 2a, on the other hand, illustrates a static-type, magnitude comparator using a pass logic function. The comparator of FIG. 2a compares a first binary number (A) with a second binary number (B) and determines if the first binary number (A) is either: (i) greater than the second binary number (B); or (ii) less than or equal to the second binary number (B). FIG. 2b illustrates the circuitry of each cell in the comparator of FIG. 2a. See Neil Weste and Karman Eshraghian, "Principles of CMOS VLSI Design, A Systems Perspective §8.2.9" (VLSI System Series, 1985), citing ELECTRONICS (McGraw-Hill Inc., Sep. 22, 1983), which is incorporated herein by reference.

One skilled in the art will appreciate that there is a need for a static-type, magnitude comparator that can compare a first binary number with a second binary number and determine if: (i) the first binary number is equal to the second binary number; (ii) the first binary number is greater than the second binary number; or (iii) the first binary number is less than the second binary number. Furthermore, there is a need for a static-type, magnitude comparator that not only makes these determinations but also includes timing circuitry for timing the comparator's operations.

SUMMARY OF THE INVENTION

The comparator of the present invention is a static-type comparator that compares the magnitude of two binary numbers and determines if: (i) the numbers are equal; (ii) the first number is greater than the second number; or (iii) the first number is less than the second number. The comparator comprises a carry chain of comparison cells. Each comparison cell in the carry chain compares the magnitude of a different bit position of a first binary number with a corresponding bit position in a second binary number. For example, to compare a first three-bit binary number with a second three-bit binary number requires a carry chain of three comparison cells.

Each comparison cell in the carry chain includes a first input, for inputting a first voltage signal representing a binary value of a bit position of the first number, and a second input, for inputting a second voltage signal representing a binary value of a corresponding bit position of the second number. Each comparison cell also includes a carry-in input, a carry-out output, and a second output.

In a carry chain of two comparison cells, the carry-out output of the comparison cell for the most significant bit (MSB) position connects to the carry-in input of the comparison cell for the least significant bit (LSB) position. In a carry chain of more than two comparison cells, each comparison cell between the MSB position comparison cell and the LSB position comparison cell has its carry-in input connected to the carry-out output of a comparison cell for a bit position that is one bit position more significant, and its carry-out output connected to the carry-in input of a comparison cell for a bit position that is one-bit position less significant. For example, in a three-bit carry chain, the comparison cell for the MSB-1 position has its carry-in input connected to the carry-out output of the MSB position comparison cell, and its carry-out output connects to the carry-in input of the LSB comparison cell.

Regardless of the number of comparison cells in the carry chain, the comparison cell for the MSB position inputs a voltage signal, from voltage source Vcc, through its carry-in input. The carry-out output of the comparison cell for the LSB position serves as an output of the carry chain.

When the magnitude of a first and second binary number are to be compared by the comparator of the present invention, the voltage signals for each bit position of the first and second numbers are input into respective comparison cells. The comparison process starts with the comparison cell for the MSB position comparing the voltage signals input into its first and second inputs. If the voltage signals are equal, the comparison cell outputs voltage signal Vcc from its carry-out output, and this voltage signal is input to the carry-in input for the comparison cell of the MSB-1 position. If the voltage signals are not equal, the voltage signal input into the first input is output from the second output of the comparison cell. If the voltage signal output through the second output is high, this indicates that the first binary number is less than the second binary number. If the voltage signal output is low, this indicates that the first binary number is greater than the second binary number.

Voltage signal Vcc will propagate from comparison cell to comparison cell in the carry chain until a difference in the magnitudes for a bit position is detected. If no difference is detected in any bit position, voltage signal Vcc propagates through the entire carry chain and is output from the carry chain by the carry-out output for the LSB position comparison cell. When voltage signal Vcc is output from the carry chain, this indicates that the first and second binary numbers are equal.

If a difference in magnitude is detected for a particular bit position, voltage signal Vcc is not output from the comparison cell for that bit position, and this breaks the carry chain. Breaking the chain causes a low signal to propagate through the comparison cells for less significant bit positions in the carry chain. This disables the second output of each of these comparison cells.

The most significant bit, if any, to have a difference in magnitude can be determined by monitoring the second output of each comparison cell. An output from the second output of a comparison cell indicates that a difference in magnitude was detected for that particular bit position and that a difference in magnitude was not detected in any comparison cell for a more significant bit position.

The comparator of the present invention is a static-type comparator and, thus, does not require timing signals to operate. However, a timing signal can be used to time the comparator's operations and improve its performance. For example, when a timing signal is used, the comparator will not output a result until the comparator circuit is settled. Furthermore, a timing signal will prevent gates in the comparator from unnecessarily burning current.

The comparator preferably also includes decode circuitry. The decode circuitry is not necessary but is useful for decoding the outputs of the carry chain into three voltage signals: "EQ," "LT," and "GT." These signals are respectively output on outputs EQ, LT and GT. A voltage signal on output EQ indicates that the comparator has determined that the first and second binary numbers are equal, while a voltage signal on output LT indicates that the first number is less than the second number, and a voltage signal on output GT indicates that the first number is greater than the second number. The decode circuitry inputs signals from the carry-out output of the LSB comparison cell, the second output of each comparison cell, and, in the preferred embodiment, a timing signal.

BRIEF DESCRIPTION OF THE DRAWINGS

A better understanding of the present invention can be obtained when the following detailed description of the preferred embodiment is considered in conjunction with the following drawings, in which:

FIG. 2b is a circuit diagram of a cell in the comparator illustrated in FIG. 2a;

FIG. 3b is a timing diagram of the operations of the comparator illustrated in FIG. 3a.

DETAILED DESCRIPTION OF THE PREFERRED EMBODIMENT

Figure 3A:
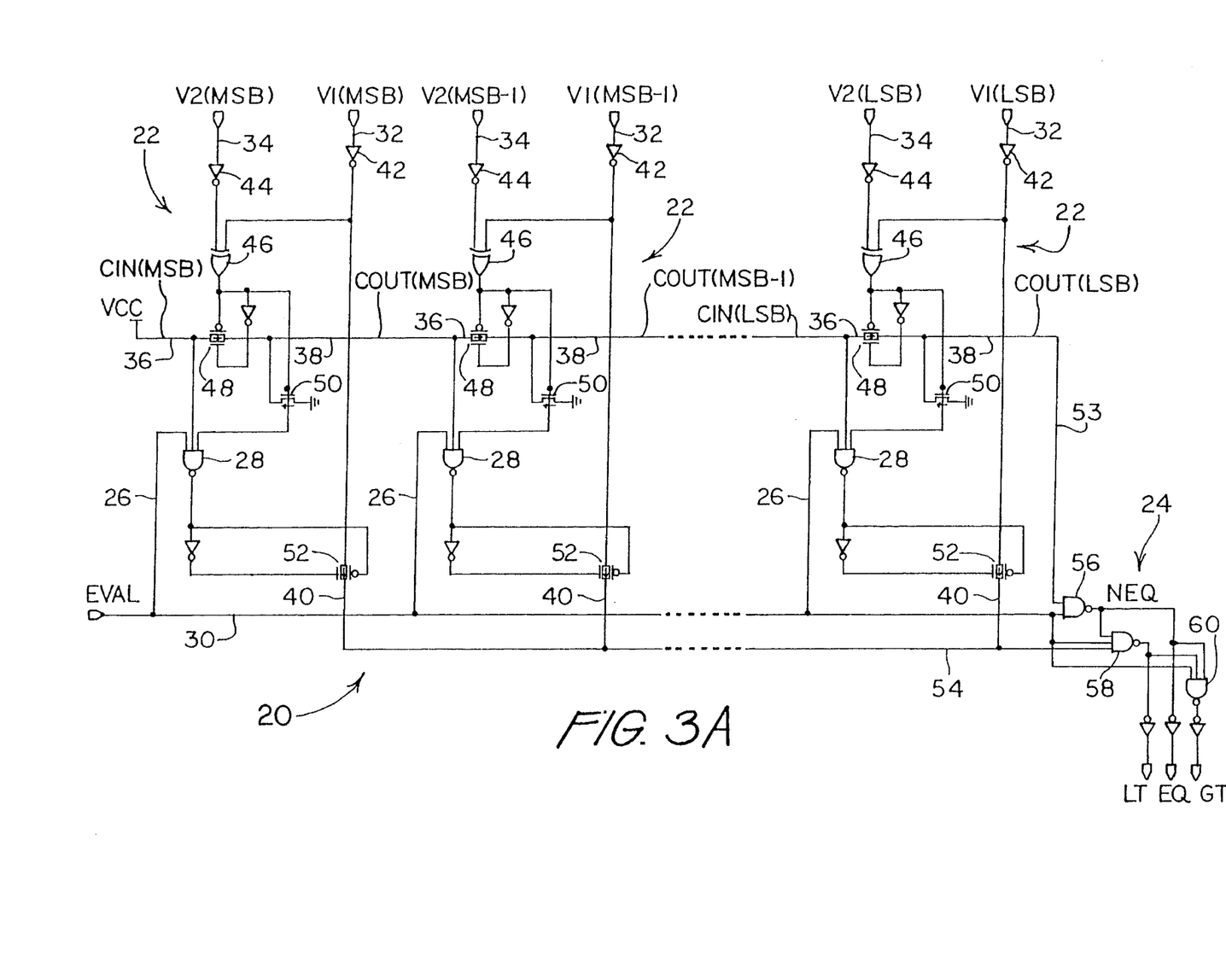
FIG. 3a is a circuit diagram of a comparator in accordance with the present invention.
Figure 3B:
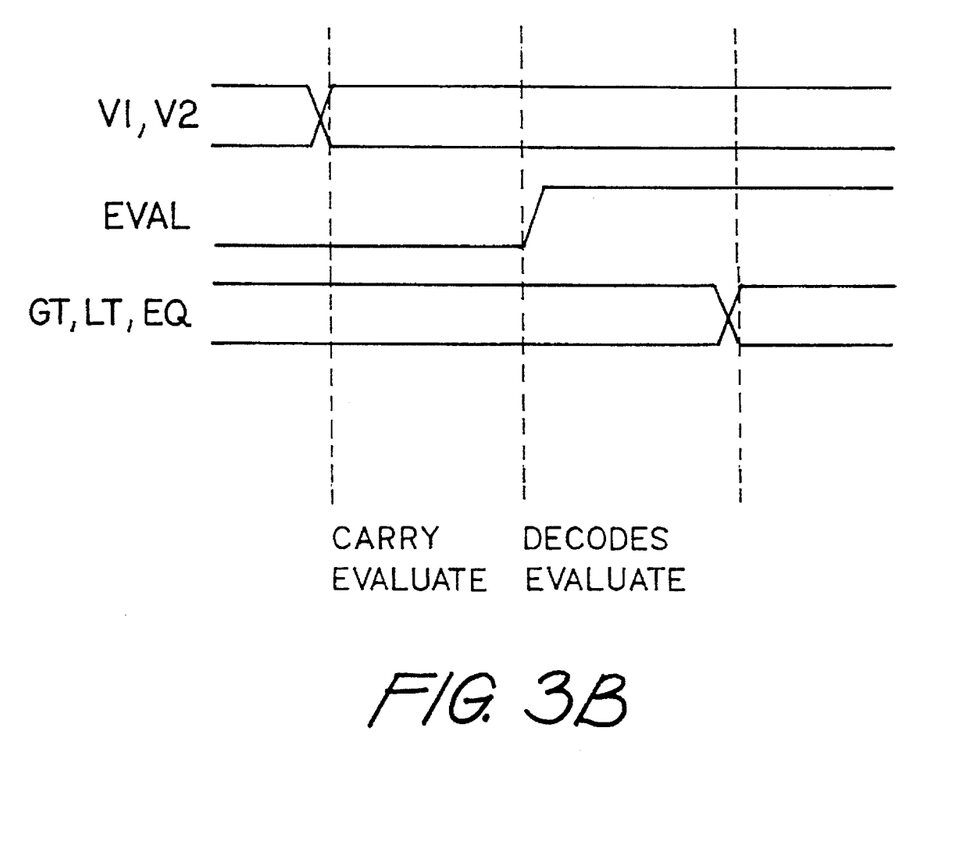

FIG. 3a is a circuit diagram of the preferred embodiment of the comparator of the present invention. The comparator of the present invention is a static-type comparator and does not require timing signals to operate. However, a timing signal can be used to time the comparator's operations and improve its performance. For example, when a timing signal is used, the comparator will not output a result until the circuit is settled. Furthermore, a timing signal will prevent gates in the comparator from unnecessarily burning current. The comparator illustrated in FIG. 3a inputs a timing signal to time its operations. FIG. 3b sets forth a timing diagram of operations of the comparator illustrated in FIG. 3a.

The comparator of the present invention compares a first binary number with a second binary number and determines if the first number is equal to, greater than, or less than the second number. As is illustrated in FIG. 3a, comparator 20 comprises a chain of comparison cells 22. The chain of comparison cells is referred to as a carry chain. Each comparison cell in the carry chain compares the magnitude of a different bit position of a first binary number with the magnitude of a corresponding bit position in a second binary number. For example, in the comparator illustrated in FIG. 3a, there are three comparison cells for comparing a first three-bit binary number with a second three-bit binary number. The left-most comparison cell compares the most significant bit (MSB) positions of the three-bit numbers, the middle comparison cell compares the MSB-1 bit positions, and the right-most comparison cell compares the least significant bit (LSB) positions. Thus, the number of comparison cells is equal to the number of bit positions being compared. For example, for comparing six-bit binary numbers, the carry chain of FIG. 3a would be expanded to six comparison cells.

Comparator 20 preferably also includes decode circuitry 24. See FIG. 3a. As is discussed below, decode circuitry 24 is not necessary but is useful for decoding the outputs of the carry chain into three voltage signals: "EQ," "LT," and "GT." These signals are respectively output on outputs EQ, LT and GT. A voltage signal on output EQ indicates that comparator 20 has determined that the first and second binary numbers are equal, while a voltage signal on output LT indicates that the first number is less than the second number, and a voltage signal on output GT indicates that the first number is greater than the second number.

Comparator 20 preferably also includes a timing signal input EVAL for inputting a timing signal. As is discussed above and below, the timing signal is not necessary but provides certain benefits. Input EVAL is connected to NAND gate 28 in each comparison cell 22, by connection 26, and is connected to decode circuitry 24 by connection 30.

Each comparison cell 22 includes a first input 32, for inputting a first voltage signal representing a binary value of a bit position of a first binary number, and a second input 34, for inputting a second voltage signal representing a binary value of a corresponding bit position of a second binary number. The comparison cells also include a carry-in input 36, a carry-out output 38, and a second output 40.

The signals input through inputs 32 and 34 are respectively inverted by inverters 42 and 44, and the inverted signals are input into exclusive OR gate 46. When the first voltage signal and second voltage signal are equal, exclusive OR gate 46 outputs a low signal which enables CMOS transfer gate 48. When transfer gate 48 is enabled, it passes the voltage signal that was input to carry-in input 36 to carry-out output 38.

If the first voltage signal and second voltage signal are not equal, exclusive OR gate 46 outputs a high signal which turns off transfer gate 48, and NMOS transistor 50 pulls down carry-out output 38 to a low value. NAND gate 28 inputs the signal from the carry-in input, the timing signal from the input EVAL, and the output signal from exclusive OR gate 46. Thus, when the first and second voltage signals are not equal (i.e., exclusive OR gate 46 outputs a high signal) and the carry-in input signal and timing signal are high, NAND gate 28 outputs a low signal which enables CMOS transfer gate 52. When transfer gate 52 is enabled, the second output 40 outputs the voltage signal that is input to the first input 32 and inverted by inverter 42. For example, if the voltage signal input to first input 32 is high, it is inverted by inverter 42, and this inverted signal (now a low signal) is output through second output 40 when the first and second voltage signals are not equal. If the voltage signal output through second output 40 is high, this indicates that the binary value of the bit position of the first number is less than the binary value of the bit position of the second number. On the other hand, if the voltage signal output is low, this indicates that the binary value of the bit position of the first number is greater than the binary value of the bit position of the second number.

In a carry chain, a plurality of comparison cells 22 are connected together. The comparison cell for the MSB position of the carry chain inputs a voltage signal, from voltage source VCC, through its carry-in input 36. This comparison cell is connected to the carry-in input 36 of the comparison cell for the MSB-1 bit position through its carry-out output 38. If there are only three comparison cells 22 in the carry chain, as in the comparator of FIG. 3a, the comparison cell for the LSB position is connected to the carry-out output 38 of the comparison cell for the MSB-1 bit position through its carry-in input 36. If there are only two comparison cells 22 in the chain, the carry-in input 36 for the LSB position is connected to the carry-out output 38 for the MSB position comparison cell. As will be apparent from the discussion below, the carry-out output 38 of the comparison cell for the LSB position serves as an output terminal for the comparator. In the preferred embodiment, this carry-out output 38 is connected to decode circuitry 24 by connection 53.

In a carry chain of more than three comparison cells 22, the comparison cells between the MSB position comparison cell and the LSB position comparison cell have their carry-in input 36 connected to the carry-out output 38 of a comparison cell for a bit position that is one bit position more significant, and their carry-out output 38 connected to the carry-in input 36 of a comparison cell for a bit position that is one bit position less significant.

When the magnitude of a first and second binary number are to be compared by comparator 20, the voltage signals for each bit position of the first and second numbers are input into respective comparison cells 22. The comparison process starts with the comparison cell 22 for the MSB position comparing the voltage signals input to the first input 32 and second input 34. If the voltage signals are equal, the comparison cell 22 outputs voltage signal Vcc from the carry-out output 38, and this voltage signal is input to the carry-in input 36 for the comparison cell of the MSB-1 position, if there are more than two comparison cells, or the LSB position, if there are only two comparison cells. If the voltage signals are not equal, the second output 40 outputs the voltage signal that was input to the first input 32 and inverted by inverter 42. If the voltage signal output through the second output 40 is high, this indicates that the first binary number is less than the second binary number. If the voltage signal output is low, this indicates that the first binary number is greater than the second binary number.

Voltage signal Vcc will propagate from comparison cell 22 to comparison cell in the carry chain until a difference in the magnitudes for a bit position is detected. If no difference is detected in any bit position, voltage signal Vcc propagates through the entire carry chain and is output from the carry chain by output 38 of the comparison cell 22 of the LSB position. When voltage signal Vcc is output from the carry chain, this indicates that the first and second binary numbers are equal.

If a difference in magnitude is detected for a particular bit position, voltage signal Vcc is not output from the comparison cell 22 for that bit position, and this breaks the carry chain. The comparison cells 22 for any less significant bit positions propagate a low signal which is eventually output through output 38 of the comparison cell 22 for the LSB position. Second output 40 of each of those comparison cells 22 is disabled and, thus, the comparison cells do not output a signal from second output 40.

Starting with the MSB position, the first comparison cell 22 in the carry chain to detect a difference in magnitudes for a particular bit position outputs a voltage signal from its second output 40. Whenever a difference in magnitudes is detected by a comparison cell 22, this indicates that the first and second binary numbers are not equal. As discussed above, the value of the signal output from output 40 indicates if the first number is greater than or less than the second number. Once a difference in magnitudes is detected by a comparison cell, comparison of less significant bit positions is irrelevant to the determination of whether the first number is greater than or less than the second number. Thus, whenever an output is detected from output 40 of any comparison cell 22, this indicates that the first and second number are not equal, and the signal output from output 40 indicates whether the first number is greater than or less than the second number.

The most significant bit, if any, to have a difference in magnitudes can be determined by monitoring the output 40 of each comparison cell 22. An output from output 40 of a comparison cell 22 indicates that a difference in magnitude was detected for that particular bit position and that a difference in magnitude was not detected in any comparison cell for a more significant bit position.

As discussed above, in the preferred embodiment, a timing signal is used to time the comparator's 20 operations. The timing signal is input to the comparator 20 through input EVAL and does not go high until the carry chain has settled. When the timing signal goes high, if a comparison cell 22 has detected a difference in magnitudes for a bit position, the CMOS transfer gate 52 for that comparison cell will drive an output signal on output 40.

Output 40 of each comparison cell can be connected together by connection 54. In the preferred embodiment, connection 54 is also connected to decode circuitry 24. As discussed above, preferably the timing signal is also input, through connection 30, to decode circuitry 24.

When decode circuitry 24 is provided, if a voltage signal is output from the carry chain on connection 53, it is ANDed, by NAND gate 56, with the timing signal on connection 30, to generate the signal on output EQ. Signal NEQ, the output of NAND gate 56 and the compliment of the signal on output EQ, is an input to NAND gates 58 and 60. NAND gate 58 additionally inputs the timing signal from input EVAL and the signal on connection 54. NAND gate 60 additionally inputs the timing signal from input EVAL and the output from NAND gate 58. NAND gates 58 and 60 respectively generate the output signals on outputs LT and GT. Signal NEQ keeps NAND gate 58 from burning power when the first and second binary numbers are equal. The timing signal input to NAND gate 58 keeps it from burning power when connection 54 floats. Connection 54 will float when none of the comparison cells 22 has output a signal, such as when the first and second numbers are in the process of being compared, or are equal.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. A comparator circuit for comparing a first binary number having x bit positions with a second binary number having x bit positions, comprising:

(a) a carry chain circuit of x comparison cells, each of said comparison cells having a first cell input for inputting a first voltage signal representing a binary value of a different bit position of said first number, a second cell input for inputting a second voltage signal representing a binary value of a bit position of said second number, said bit position of said second number corresponding to said bit position of said first number, and a first cell output;

(b) a first carry chain input for inputting a third voltage to said carry chain circuit;

(c) a first carry chain output for outputting said third voltage from said carry chain circuit; and (d) a second carry chain output connected to each of said first cell outputs;

wherein when said first binary number is equal to said second binary number, said comparator will output said third voltage signal through said first carry chain output, when said first binary number is greater than said second binary number, said comparator will output a fourth voltage signal through said second carry chain output, and when said first binary number is less than second binary number, said comparator will output a fifth voltage signal through said second carry chain output.

2. The comparator of claim 1, further comprising a second carry chain input for inputting a timing signal to said carry chain circuit.

3. The comparator of claim 2, further comprising:

a timing signal supply input connected to said second carry chain input and connected to decode circuitry; and decode circuitry connected to said first and second carry chain outputs and said timing signal supply input for outputting one or more output voltage signals indicating whether said comparator circuit has determined that said first and second binary numbers are equal, said first binary number is greater than said second binary number, or said first binary number is less than said second binary number.

4. A comparator circuit for comparing a first binary number having x bit positions with a second binary number having x bit positions, comprising:

(a) x comparison cells, wherein each comparison cell compares a different bit position of said first binary number with a corresponding bit position of said second binary number, each comparison cell including, a first input for inputting a first voltage signal representing a binary value of a bit position of said first number, a second input for inputting a second voltage signal representing a binary value of a bit position of said second number, said bit position of said second number corresponding to said bit position of said first number, a third input, a fourth input, a first output, and a second output connected to decode circuitry, wherein each comparison cell, other than a comparison cell for a least significant bit position, has its first output connected to said third input of a comparison cell for a bit position that is one bit position less significant, wherein each comparison cell, other than a comparison cell for a most significant bit position, has its third input connected to said first output of a comparison cell for a bit position that is one bit position more significant, wherein said third input of said most significant bit comparison cell inputs a third voltage signal, and said first output of said least significant bit comparison cell is connected to said decode circuitry, and wherein when said third voltage signal is input into one of said comparison cells through said third input, said comparison cell will output said third voltage signal through said first output when said binary value of said bit position of said first number is equal to said binary value of said bit position of said second number, said comparison cell will output a fourth voltage signal through said second output when said binary value of said bit position of said first number is greater than said binary value of said bit position of said second number, and said comparison cell will output a fifth voltage signal through said second output when said binary value of said bit position of said first number is less than said binary value of said bit position of said second number;

(b) a timing signal supply input connected to said fourth input of each of said comparison cells and said decode circuitry; and (c) decode circuitry for outputting one or more output voltage signals indicating whether said comparator has determined that said first and second binary numbers are equal, said first binary number is greater than said second binary number, or said first binary number is less than said second binary number.

5. A comparator circuit for comparing a first binary number having x bit positions with a second binary number having x bit positions, comprising:

(a) a carry chain circuit of x comparison cells, each of said comparison cells having a first cell input for inputting a first voltage signal representing a binary value of a different bit position of said first number, a second cell input for inputting a second voltage signal representing a binary value of a bit position of said second number, said bit position of said second number corresponding to said bit position of said first number, and a first cell output;

(b) a first carry chain input for inputting a third voltage to said carry chain circuit;

(c) a first carry chain output for outputting said third voltage from said carry chain circuit; and (d) a second carry chain output connected to each of said first cell outputs;

wherein said comparator circuit includes means for outputting said third voltage signal through said first carry chain output when said first binary number is equal to said second binary number, for outputting a fourth voltage signal through said second carry chain output when said first binary number is greater than said second binary number, and for outputting a fifth voltage signal through said second carry chain output when said first binary number is less than said second binary number.

6. The comparator of claim 5, further comprising a second carry chain input for inputting a timing signal to said carry chain circuit.

7. The comparator of claim 6, further comprising:

a timing signal supply input connected to said second carry chain input and connected to decode means; and decode means, connected to said first and second carry chain outputs and said timing signal supply input, for outputting one or more output voltage signals indicating whether said comparator circuit has determined that said first and second binary numbers are equal, said first binary number is greater than said second binary number, or said first binary number is less than said second binary number.

8. A comparator circuit for comparing a first binary number having x bit positions with a second binary number having x bit positions, comprising:

(a) x comparison cells, wherein each comparison cell compares a different bit position of said first binary number with a corresponding bit position of said second binary number, each comparison cell including,
  a first input for inputting a first voltage signal representing a binary value of a bit position of said first number,
  a second input for inputting a second voltage signal representing a binary value of a bit position of said second number, said bit position of said second number corresponding to said bit position of said first number,
  a third input,
  a fourth input,
  a first output, and
  a second output connected to decode means,
  wherein each comparison cell, other than a comparison cell for a least significant bit position, has its first output connected to said third input of a comparison cell for a bit position that is one bit position less significant,
  wherein each comparison cell, other than a comparison cell for a most significant bit position, has its third input connected to said first output of a comparison cell for a bit position that is one bit position more significant,
  wherein said third input of said most significant bit comparison cell inputs a third voltage signal, and said first output of said least significant bit comparison cell is connected to said decode means, and
  wherein each of said comparison cells has means for outputting said third voltage signal through said first output when said binary value of said bit position of said first number is equal to said binary value of said bit position of said second number, for outputting a fourth voltage signal through said second output when said binary value of said bit position of said first number is greater than said binary value of said bit position of said second number, and for outputting a fifth voltage signal when said binary value of said bit position of said first number is less than said binary value of said bit position of said second number;

(b) a timing signal supply input connected to said fourth input of each of said comparison cells and said decode means; and (c) decode means for outputting one or more output voltage signals indicating whether said comparator has determined that said first and second binary numbers are equal, said first binary number is greater than said second binary number, or said first binary number is less than said second binary number.

9. A method of using a comparator circuit to compare a first binary number having x bit positions with a second binary number having x bit positions, wherein said comparator circuit comprises a carry chain circuit of x comparison cells, and wherein each comparison cell compares a binary value of a different bit position in said first number with a binary value of a corresponding bit position in said second number, comprising the steps off (a) inputting into each of said x comparison cells a first voltage signal, representing a binary value of a different bit position of said first number, and a second voltage signal, representing a binary value of a corresponding bit position of said second number;

(b) inputting a third voltage signal into said carry chain circuit;

(c) outputting said third voltage signal from a first output of said carry chain circuit when said first number is equal to said second number;

(d) outputting a fourth voltage signal from a second output of said carry chain circuit when said first number is greater than said second number; and (e) outputting a fifth voltage signal from said second output of said carry chain circuit when said first number is less than said second number.

10. The method of claim 9, further comprising the step of inputting a timing signal into said carry chain circuit to time said comparator circuit's operations.

11. The method of claim 9, further comprising the step of decoding said voltage signals output from said carry chain circuit and outputting one or more voltage signals from said comparator circuit which indicate whether said comparator circuit has determined that said first number is equal to said second number, said first number is greater than said second number, or said first number is less than said second number.

12. The method of claim 10, further comprising the step of decoding said voltage signals output from said carry chain circuit and outputting one or more voltage signals from said comparator circuit which indicate whether said comparator circuit has determined that said first number is equal to said second number, said first number is greater than said second number, or said first number is less than said second number.

13. A method of using a comparator circuit to compare a first binary number having x bit positions with a second binary number having x bit positions, wherein said comparator circuit comprises a carry chain circuit of x comparison cells, wherein each comparison cell compares a binary value of a different bit position in said first number with a binary value of a corresponding bit position in said second number, and wherein each comparison cell has a first output, comprising the steps of:

(a) inputting into each of said x comparison cells a first voltage signal, representing a binary value of a different bit position of said first number, and a second voltage signal, representing a binary value of a corresponding bit position of said second number;

(b) inputting a third voltage signal into said carry chain circuit;

(c) outputting said third voltage signal from said carry chain circuit if said first number is equal to said second number;

(d) outputting a fourth voltage signal from said first output of a comparison cell that detects a difference in magnitude for its bit position, when said first number is greater than said second number, and when a comparison cell for a more significant bit position has not detected a difference in magnitude; and (e) outputting a fifth voltage signal from said first output of a comparison cell that detects a difference in magnitude for its bit position, when said first number is less than said second number, and when a comparison cell for a more significant bit position has not detected a difference in magnitude.

14. The method of claim 13 further comprising the step of determining what bit position of said first and second binary numbers has a difference in magnitude, if any, by detecting which one of said comparison cells has output said fourth or fifth voltage signal.

* * * * *